(12) United States Patent
Fisher, Jr. et al.

(10) Patent No.: US 8,654,537 B2
(45) Date of Patent: Feb. 18, 2014

(54) PRINTED CIRCUIT BOARD WITH INTEGRAL RADIO-FREQUENCY SHIELDS

(75) Inventors: Joseph Fisher, Jr., San Jose, CA (US); Sean Mayo, Mountain View, CA (US); Dennis R. Pyper, San Jose, CA (US); Paul Nangeroni, Mountain View, CA (US); Jose Mantovani, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 282 days.

(21) Appl. No.: 12/958,293

(22) Filed: Dec. 1, 2010

(65) Prior Publication Data
US 2012/0140423 A1   Jun. 7, 2012

(51) Int. Cl.
*H05K 1/00*   (2006.01)
(52) U.S. Cl.
USPC ........... 361/750; 361/765; 361/816; 361/818; 174/394; 174/521; 174/546; 438/29; 438/106; 438/110; 438/113; 438/517; 438/528; 438/689; 438/795; 257/79; 257/106; 257/110; 257/113; 257/517; 257/528; 257/689; 257/795
(58) Field of Classification Search
USPC .......... 361/750, 765, 816, 818; 174/394, 521, 174/546; 438/29, 106, 110, 113, 517, 528, 438/689, 795; 257/79, 106, 110, 113, 517, 257/528, 689, 795
See application file for complete search history.

(56) References Cited

U.S. PATENT DOCUMENTS

| | | | |
|---|---|---|---|
| 638,820 A | 12/1899 | Swaab et al. | |
| 753,796 A | 3/1904 | Jarvis et al. | |
| 4,717,990 A | 1/1988 | Tugcu | |
| 4,994,659 A | 2/1991 | Yabe et al. | |
| 5,177,324 A | 1/1993 | Carr et al. | |
| 5,316,165 A | 5/1994 | Moran | |
| 5,461,545 A * | 10/1995 | Leroy et al. | 361/765 |
| 5,480,840 A * | 1/1996 | Barnes et al. | 438/107 |
| 5,600,181 A * | 2/1997 | Scott et al. | 257/723 |
| 5,694,300 A * | 12/1997 | Mattei et al. | 361/818 |
| 5,761,053 A | 6/1998 | King et al. | |
| 5,987,739 A * | 11/1999 | Lake | 29/841 |
| 5,990,989 A | 11/1999 | Ozawa | |
| 6,218,610 B1 | 4/2001 | Suzuki | |
| 6,326,544 B1 * | 12/2001 | Lake | 174/546 |
| 6,455,936 B1 * | 9/2002 | Lo et al. | 257/758 |
| 6,476,463 B1 * | 11/2002 | Kaneko et al. | 257/660 |
| 6,483,719 B1 | 11/2002 | Bachman | |

(Continued)

OTHER PUBLICATIONS

Just et al. U.S. Appl. No. 12/968,065, filed Dec. 14, 2010.

*Primary Examiner* — Xiaoliang Chen
(74) *Attorney, Agent, or Firm* — Treyz Law Group; G. Victor Treyz; David C. Kellogg

(57) ABSTRACT

Electrical components such as integrated circuits may be mounted on a printed circuit board. To prevent the electrical components from being subjected to electromagnetic interference, radio-frequency shielding structures may be formed over the components. The radio-frequency shielding structures may be formed from a layer of metallic paint. Components may be covered by a layer of dielectric. Channels may be formed in the dielectric between blocks of circuitry. The metallic paint may be used to coat the surfaces of the dielectric and to fill the channels. Openings may be formed in the surface of the metallic paint to separate radio-frequency shields from each other. Conductive traces on the surface of the printed circuit board may be used in connecting the metallic paint layer to internal printed circuit board traces.

10 Claims, 12 Drawing Sheets

(56) References Cited

U.S. PATENT DOCUMENTS

| | | | | |
|---|---|---|---|---|
| 6,600,101 | B2 | 7/2003 | Mazurkiewicz | |
| 6,659,512 | B1 | 12/2003 | Harper et al. | |
| 6,671,183 | B2 | 12/2003 | Tsuzuki | |
| 6,733,954 | B2 * | 5/2004 | Yamamoto et al. | 430/311 |
| 6,738,249 | B1 | 5/2004 | Anthony et al. | |
| 6,884,938 | B2 * | 4/2005 | Aoyagi | 174/359 |
| 6,952,046 | B2 * | 10/2005 | Farrell et al. | 257/678 |
| 6,977,187 | B2 * | 12/2005 | Farrell et al. | 438/106 |
| 7,089,646 | B2 | 8/2006 | Leerkamp et al. | |
| 7,102,896 | B2 * | 9/2006 | Ajioka et al. | 361/816 |
| 7,177,161 | B2 | 2/2007 | Shima | |
| 7,180,012 | B2 * | 2/2007 | Tsuneoka et al. | 174/521 |
| 7,381,906 | B2 | 6/2008 | Holmberg | |
| 7,446,265 | B2 | 11/2008 | Krohto et al. | |
| 7,476,566 | B2 * | 1/2009 | Farrell et al. | 438/110 |
| 7,478,474 | B2 * | 1/2009 | Koga | 29/841 |
| 7,586,185 | B2 * | 9/2009 | Fukasawa | 257/688 |
| 7,643,311 | B2 * | 1/2010 | Coffy | 361/818 |
| 7,649,499 | B2 | 1/2010 | Watanabe | |
| 7,651,889 | B2 | 1/2010 | Tang et al. | |
| 7,743,963 | B1 * | 6/2010 | Chung | 228/179.1 |
| 7,745,910 | B1 * | 6/2010 | Olson et al. | 257/659 |
| 7,898,066 | B1 * | 3/2011 | Scanlan et al. | 257/659 |
| 7,906,371 | B2 * | 3/2011 | Kim et al. | 438/113 |
| 7,972,901 | B2 * | 7/2011 | Farrell et al. | 438/106 |
| 7,989,928 | B2 * | 8/2011 | Liao et al. | 257/659 |
| 8,008,753 | B1 * | 8/2011 | Bolognia | 257/659 |
| 8,022,511 | B2 * | 9/2011 | Chiu et al. | 257/659 |
| 8,030,750 | B2 * | 10/2011 | Kim et al. | 257/690 |
| 8,093,690 | B2 * | 1/2012 | Ko et al. | 257/660 |
| 8,093,691 | B1 * | 1/2012 | Fuentes et al. | 257/660 |
| 8,110,902 | B2 * | 2/2012 | Eun et al. | 257/659 |
| 8,212,339 | B2 * | 7/2012 | Liao et al. | 257/659 |
| 8,212,340 | B2 * | 7/2012 | Liao | 257/660 |
| 2002/0011907 | A1 * | 1/2002 | Yamada et al. | 333/204 |
| 2002/0119585 | A1 * | 8/2002 | Yamazaki et al. | 438/29 |
| 2002/0153360 | A1 * | 10/2002 | Yamazaki et al. | 219/121.66 |
| 2002/0192931 | A1 * | 12/2002 | Hayakawa | 438/528 |
| 2003/0057544 | A1 | 3/2003 | Nathan et al. | |
| 2004/0121602 | A1 * | 6/2004 | Maruyama et al. | 438/689 |
| 2004/0178495 | A1 * | 9/2004 | Yean et al. | 257/723 |
| 2004/0232452 | A1 * | 11/2004 | Tsuneoka et al. | 257/222 |
| 2004/0233035 | A1 * | 11/2004 | Fjelstad | 338/260 |
| 2004/0259389 | A1 * | 12/2004 | Yamazaki et al. | 438/795 |
| 2005/0040762 | A1 * | 2/2005 | Kurihara | 313/512 |
| 2005/0064685 | A1 * | 3/2005 | Hayakawa | 438/517 |
| 2005/0253994 | A1 * | 11/2005 | Kamijima et al. | 349/155 |
| 2006/0258050 | A1 * | 11/2006 | Fujiwara et al. | 438/112 |
| 2007/0035676 | A1 * | 2/2007 | Hosoya | 349/43 |
| 2007/0120132 | A1 * | 5/2007 | Maruyama et al. | 257/79 |
| 2008/0019112 | A1 * | 1/2008 | Hatanaka et al. | 361/814 |
| 2009/0236700 | A1 * | 9/2009 | Moriya | 257/659 |
| 2009/0289548 | A1 * | 11/2009 | Maruyama et al. | 313/512 |
| 2010/0087222 | A1 * | 4/2010 | Yamashita et al. | 455/550.1 |
| 2011/0063810 | A1 | 3/2011 | Chen et al. | |
| 2012/0000699 | A1 * | 1/2012 | Inoue | 174/257 |

* cited by examiner

PRINTED CIRCUIT BOARD WITH INTEGRAL RADIO-FREQUENCY SHIELDS

BACKGROUND

This relates to structures for providing electromagnetic shielding for circuits such as radio-frequency circuits.

Electronic devices such as computers, cellular telephones, and other devices often contain circuitry that requires electromagnetic shielding. For example, some electronic devices include radio-frequency transceiver circuits. Electronic devices may also include memory and other components that use clocks. If care is not taken, signals from one circuit may interfere with the proper operation of another circuit. For example, a clock signal or a clock signal harmonic that falls within the operating band of a radio-frequency receiver may cause undesirable interference for the receiver.

To prevent disruption from electromagnetic interference, circuits such as transceivers may be enclosed within metal radio-frequency (RF) shielding cans. The metal of the shielding cans blocks radio-frequency signals and helps shield the enclosed components from electromagnetic interference (EMI). In a typical configuration, integrated circuits are covered by RF shielding cans after being mounted on a printed circuit board.

Conventional arrangements in which RF shielding cans are mounted to a printed circuit board can help to reduce electromagnetic interference, but may be undesirably bulky. This may limit the effectiveness of RF shielding can arrangements in complex board designs in which numerous sections of the board require individual shielding.

It would therefore be desirable to provide improved radio-frequency shielding structures.

SUMMARY

Electrical components such as integrated circuits and associated discrete components may be organized into blocks of circuitry on a printed circuit board. The blocks of circuitry may be encapsulated in a layer of dielectric. Channels may be formed in the dielectric between the blocks of circuitry and surrounding the periphery of each block to be shielded. Each block of circuitry may be provided with an integral radio-frequency shielding structure formed from a conductive coating such as layer of metallic paint. The metallic paint may coat the planar surface of the dielectric layer and may form conductive shielding structure sidewalls by partly or completely filling the channels in the dielectric that surround the blocks.

The channels in the dielectric may be formed by applying laser light to the dielectric or by using mechanical removal techniques such as sawing. To facilitate material removal using laser light and to help prevent excess material from being removed, metal traces may be formed on the surface of the printed circuit board under the regions where the channels are to be formed. The laser light tends to reflect from the metal traces, rather than penetrate into the printed circuit board substrate. When complete, the channels can be filled with conductive material that forms conductive sidewall structures for the radio-frequency shields. Individual shielding structures may be formed by cutting openings in the conductive coating layer using a laser or other cutting tool.

A spring may be attached to the conductive coating layer. The spring may be used electrically connect the radio-frequency shielding structures to a conductive housings structure such as a conductive housing wall.

Further features of the invention, its nature and various advantages will be more apparent from the accompanying drawings and the following detailed description of the preferred embodiments.

DETAILED DESCRIPTION

This relates to radio-frequency shielding structures for electrical components. The electrical components that are shielded by the radio-frequency shielding structures may be electronic devices such as integrated circuits that operate in radio-frequency bands (e.g., transceiver integrated circuits, memory circuits and other circuits with clocks that produce signals with fundamentals or harmonics in radio-frequency bands, etc.). Shielded components may also include circuitry formed from one or more discrete components such as inductors, capacitors, and resistors, switches, etc. The electrical components that are shielded may be aggressors (components that produce radio-frequency signal interference) and/or victims (components that are sensitive to interference that is received from external sources).

The radio-frequency (RF) shielding structures may help to reduce interference from electromagnetic signals and may therefore sometimes be referred to as electromagnetic interference (EMI) shielding structures.

Electronic components with radio-frequency shielding and other electronic components may be mounted on one or more printed circuit boards in an electronic device. The printed circuit boards may be formed from rigid printed circuit board materials such as fiberglass-filled epoxy (e.g., FR4), flexible printed circuits (e.g., printed circuits formed from flexible sheets of polymer such as polyimide), and rigid flex circuits (e.g., printed circuits that contain both rigid portions and flexible tails).

Figure 1:
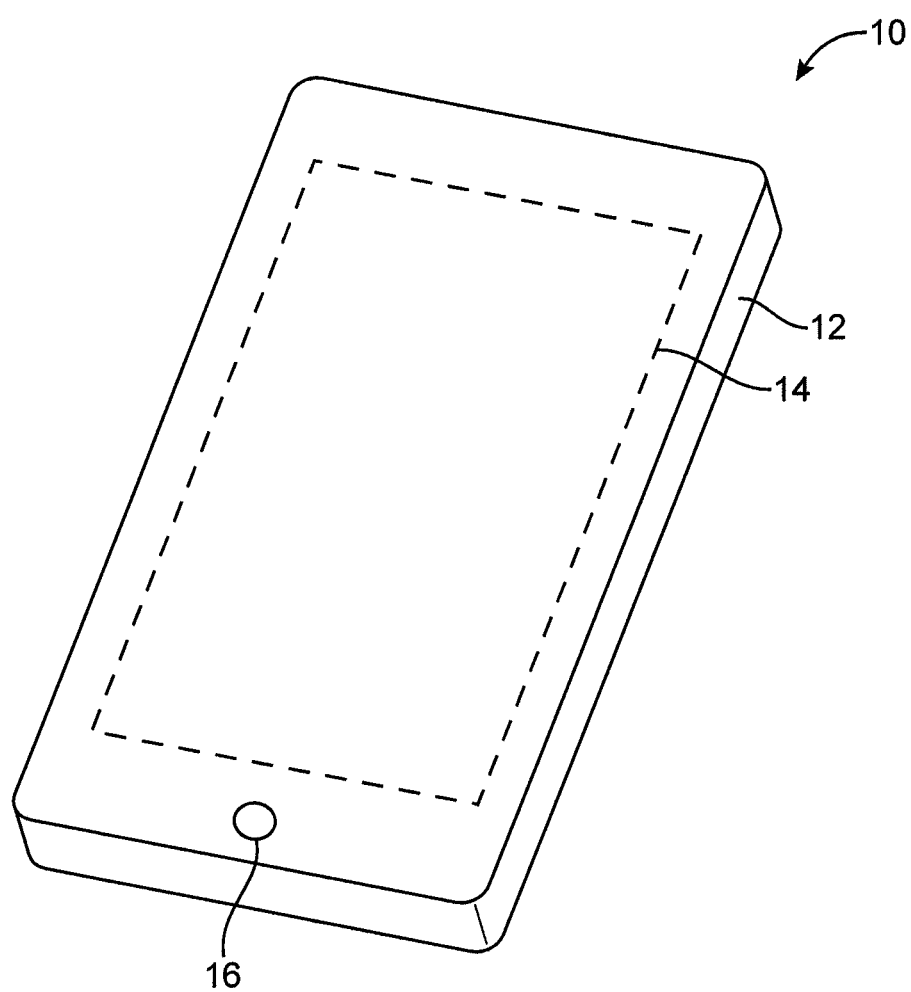
FIG. 1 is a perspective view of an illustrative electronic device in which a printed circuit board and components that are shielded with radio-frequency shielding structures may be mounted in accordance with an embodiment of the present invention.

Printed circuit boards having shielded components may be used in electronic devices such as desktop computers, laptop computers, computers built into computer monitors, tablet computers, cellular telephones, media players, gaming devices, television set top boxes, audio-video equipment, handheld devices, miniature devices such as pendant and wristwatch devices, or other electronic equipment. An illustrative electronic device that may contain electromagnetic shielding structures is shown in FIG. 1. As shown in FIG. 1, electronic device 10 may have a housing such as housing 12. Housing 12 may be formed from metal, plastic, fiber-composite materials such as carbon fiber materials, glass, ceramics, other materials, or combinations of these materials. Housing 12 may be formed from a single piece of machined metal (e.g., using a unibody-type construction) or may be formed from multiple structures that are attached together such as an internal housing frame, a bezel or band structure, housing sidewalls, planar housing wall members, etc.

As shown in the example of FIG. 1, device 10 may have a display such as display 14. Display 14 may be a liquid crystal display (LCD), a plasma display, a light-emitting diode (LED) display such as an organic light-emitting diode (OLED) display, an electronic ink display, or a display using other display structures. A capacitive touch screen array or other touch sensor may be integrated into display 14 to form a touch screen for device 10. A user may supply input for device 10 using a touch screen display or using other user input-output interface structures such as one or more buttons (see, e.g., menu button 16). Input-output ports may be formed in housing 12. For example, input-output ports may be formed to receive digital signaling cables, audio plugs, and cables associated with other devices. The illustrative configuration of device 10 that is shown in FIG. 1 is merely illustrative. Device 10 may, in general, be any suitable electronic device.

Figure 2:
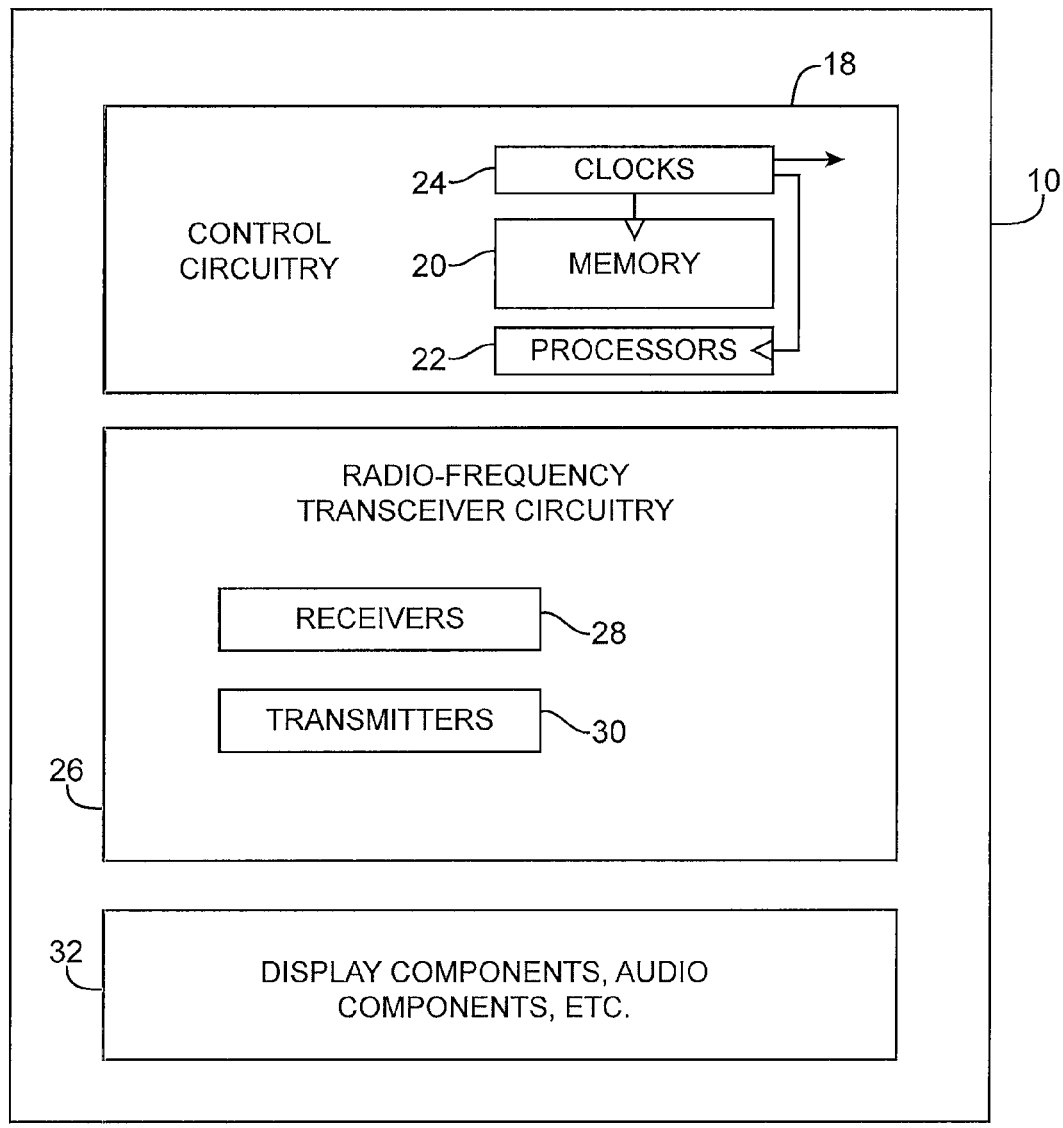
FIG. 2 is a circuit diagram of an electronic device in accordance with an embodiment of the present invention.

FIG. 2 is a circuit diagram showing illustrative circuit components that may be used in device 10. As shown in FIG. 2, device 10 may include control circuitry 18, radio-frequency transceiver circuitry 26, and additional components 32 (e.g., a display such as display 14 of FIG. 1, audio circuits such as audio codec chips, speakers, and microphones, etc.). Control circuitry 18 may include one or more processing circuits 22. Processing circuits 22 may include microprocessors, digital signal processors, application-specific integrated circuits, and processing circuitry in other integrated circuits (e.g., processing circuitry in a power management unit, processing circuitry in communications chips, etc.). Processing circuits 22 may run software code that is stored in memory 20. Memory 20 may include volatile memory such as static random-access memory, dynamic random access memory, flash memory, hard drive storage, etc.

Processors 22 and memory 20 may be clocked using one or more clock signals from clock circuits such as clock circuitry 24. For example, a clock circuit may receive a reference clock from a clock source such as a crystal oscillator and may produce one or more associated clock signals. These clock signals may be applied to electronic components in device 10, as illustrated by the application of clock signals to memory 20 and processors 22 in the FIG. 2 example.

Radio-frequency transceiver circuitry 26 may include receivers 28 and transmitters 30. Radio-frequency transceiver circuitry 26 may include wireless communications circuits that operate in cellular telephone bands (e.g., the bands at 850 MHz, 900 MHz, 1800 MHz, 1900 MHz, and 2100 MHz), wireless local area network bands (e.g., the IEEE 802.11 bands at 2.4 GHz and 5 GHz), the Bluetooth® band at 2.4 GHz, satellite navigation bands such as the Global Positioning System (GPS) band at 1575 MHz, wireless circuits for receiving radio signals such as frequency-modulation (FM) signals, etc.

Components 32 may include display drivers circuits for driving display signals into display 14 (FIG. 1), audio circuitry (e.g., circuitry that includes analog-to-digital and digital-to-analog converters), and other components. Clock circuitry 24 may distribute clocks to components 32 (e.g., clocks for clocking display driver circuits, clocks for operating analog-to-digital and digital-to-analog circuitry, etc.).

The operation of the circuitry of device 10 involves the use of clocks and other signals that have the potential to interfere with one another. For example, a clock circuit such as circuit 24 may generate a clock signal for clocking a processor or display component. The fundamental or harmonics of these clocks may fall within the operating band of one of receivers 28 (as an example) and may therefore represent a source of interference for that receiver. Signals that are generated by one of transmitters 30 may likewise serve as a source of interference for other circuitry in device 10.

To ensure that the circuitry of device 10 operates properly, it may be desirable to electromagnetically shield blocks of circuitry in device 10 from each other. For example, it may be desirable to shield a wireless communications integrated circuit so that system noise (e.g., from clocks or other noise sources) will not interfere with proper receiver operation. It may also be desirable to shield an audio circuit so that the audio circuit does not pick up noise from another circuit on device 10 or to shield memory circuits and processor circuits so that their clocks do not cause interference.

Figure 3:
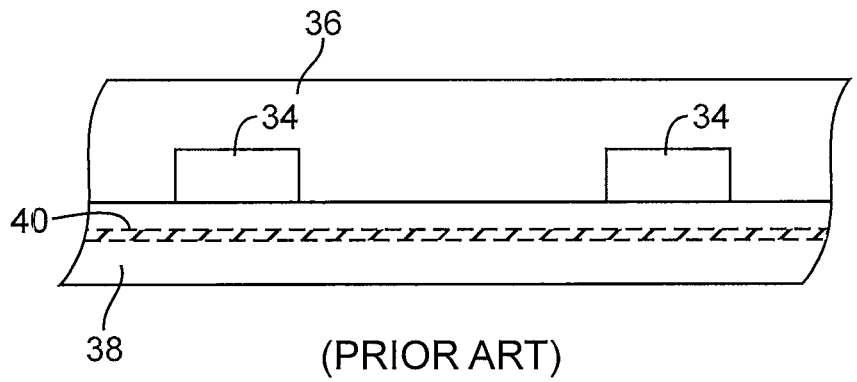
FIG. 3 is a cross-sectional side view of an illustrative printed circuit board substrate on which components have been mounted and covered with resin.
Figure 4:
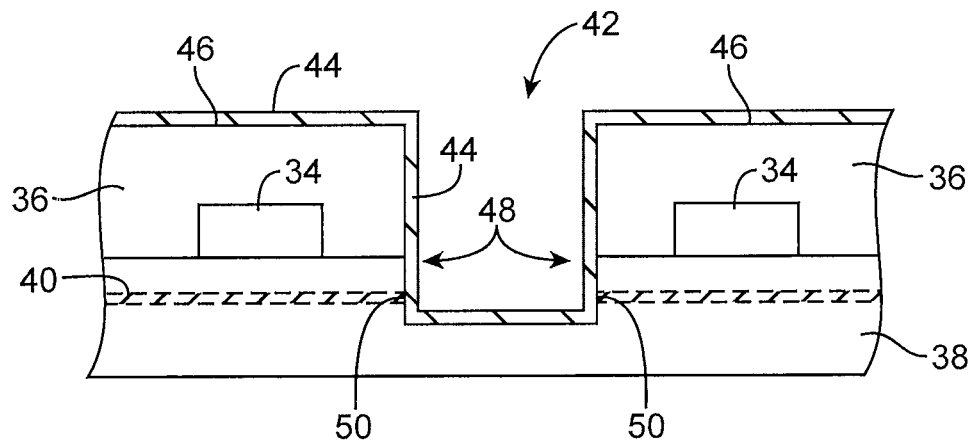
FIG. 4 is a cross-sectional side view of the printed circuit board substrate of FIG. 3 following sawing to form a groove around and between respective components and following deposition of a metallic paint such as silver paint as a coating on the resin.
Figure 5:
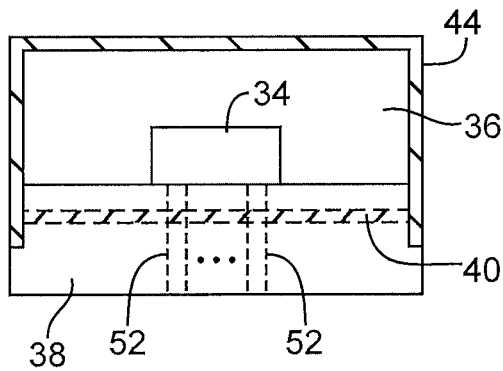
FIG. 5 is a cross-sectional side view of the printed circuit board substrate of FIG. 4 following sawing operations to divide the substrate into individual pieces.

With conventional RF shielding can arrangements, each device that is to be shielded is provided with a separate metal radio-frequency shielding can. To avoid the bulk associated with conventional radio-frequency shielding cans, some integrated circuits are available with shielding structures formed from a coating of silver paint. The formation of this type of conventional radio-frequency shielding structure is shown in FIGS. 3, 4, and 5. As shown in FIG. 3, integrated circuits 34 or other electrical components may be mounted on rigid printed circuit board 38 (e.g., using solder). Resin 36 may be used to encapsulate circuits 34. Printed circuit board 38 may include one or more conductive layers such as ground plane layer 40 of FIG. 3. Ground planer layer 40 may serve as a lower layer of radio-frequency shielding.

After encapsulating integrated circuits 34 with resin 36, a saw can be used to cut channels such as channel 42 of FIG. 4 that surround all four sides of each integrated circuit 34. The depth of each channel 42 may be sufficient to penetrate board 38 past the depth of layer 40, so that edges 50 of layer 38 are exposed.

After forming channel 42 in a rectangle surrounding each integrated circuit 34 on board 38, a coating of silver paint 44 may be screen printed onto the surface of resin 36. This coats upper planar surfaces 46 of resin 36 and channel sidewalls 48 with silver paint and forms an electrical connection between coating 44 and layer 40 at edges 50.

Following application of silver paint coating 44 of FIG. 4, a saw may be used to cut away any remaining printed circuit board material at the bottom of channel 42. This separates the individual integrated circuits 34 on board 38 from each other to form individual integrated circuit structures of the type shown in FIG. 5. Because coating 44 and layer 38 are conductive, the structures of FIG. 5 form a conductive radio-frequency shielding structure for integrated circuit 34. The structures of FIG. 5 may be mounted to a logic board (e.g., using solder). Conductive vias 52 may form electrical paths between the solder on the logic board and the input-output pads on integrated circuit 34.

In some systems, it may be desirable to provide shielding for multiple components on a single printed circuit board, while using shielding structures that have the potential to reduce system size and improve shielding performance. An illustrative layout showing how a printed circuit board in device 10 of FIG. 1 may be provided with individual compact radio-frequency shielding structures for respective circuit blocks is shown in FIG. 6.

Figure 6:
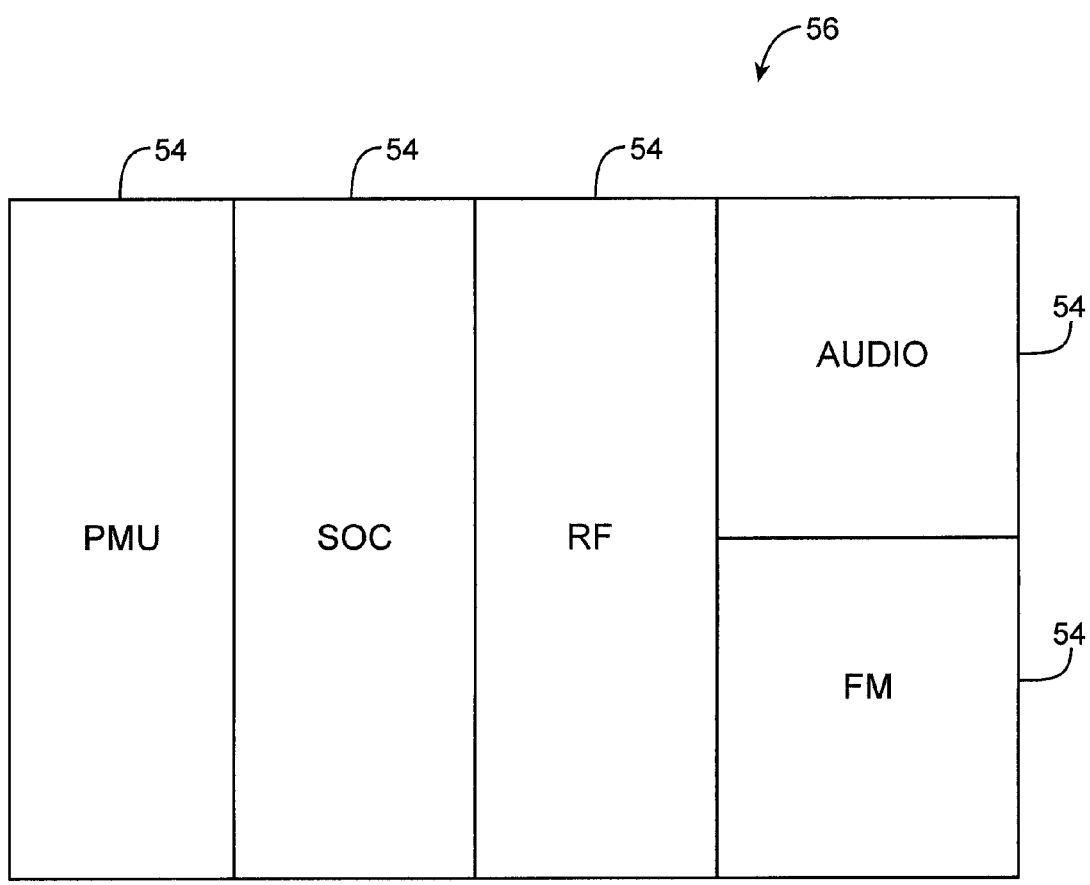
FIG. 6 is a top view of a printed circuit board substrate with electrically connected or electrically isolated shielding structures for different blocks of circuitry in accordance with an embodiment of the present invention.

As shown in FIG. 6, printed circuit board 56 may be populated with multiple blocks 54 of circuitry such as a power management unit (PMU) block, a system-on-chip (SOC) block, a radio-frequency (RF) transceiver block, an audio circuit (AUDIO) block, and a frequency modulation (FM) block (e.g., for receiving FM radio signals). Other blocks of circuitry may be provided on printed circuit board 56 if desired. The example of FIG. 6 is merely illustrative.

Each block of circuitry 54 on printed circuit board 56 may include one or more components (e.g., one or more integrated circuits, one or more discrete components, etc.). Circuit blocks typically include at least one integrated circuit, but may, if desired, contain only discrete components. In a typical block that contains an integrated circuit, one or more associated discrete components may be included (e.g., to form a circuit network that supports the operation of the integrated circuit).

Each circuit block 54 on printed circuit board 56 generally has the potential to generate radio-frequency interference and has the potential to be disrupted by radio-frequency interference from other circuit blocks. Accordingly, it may be desirable to provide all or at least some of circuit blocks 54 on printed circuit board 56 with corresponding radio-frequency shields. The radio-frequency shields on printed circuit board 56 may be formed from coatings of conductive material (e.g., silver paint or other metallic paint) and may therefore form shielding structures that are integral with board 56 (sometimes referred to as integral shielding structures). If desired, one or more regions of board 56 may be left unshielded.

Figure 7:
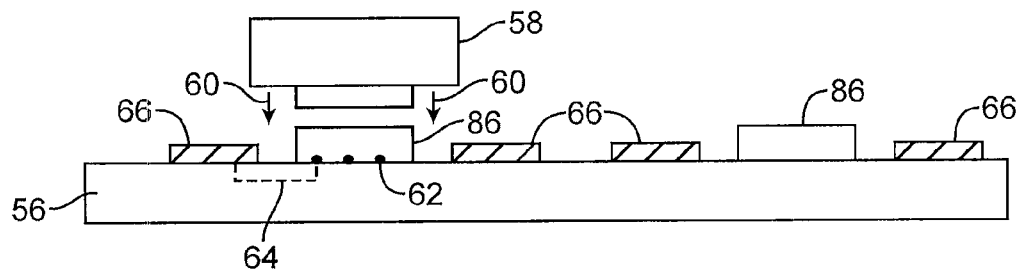
FIG. 7 is a cross-sectional side view of an illustrative printed circuit board on which components have been mounted using a mounting tool in accordance with an embodiment of the present invention.

FIGS. 7, 8, 9, and 10 are cross-sectional side views of an illustrative printed circuit board during various stages of assembly and fabrication of integrated RF shielding structures. As shown in FIG. 7, a pick-and-place tool or other suitable automated or manually controlled component mounting equipment may be used in mounting components 86 on printed circuit board 56. Components 86 may be clustered so as to form circuit blocks 54 of the type shown in FIG. 6. In some situations, a shielded circuit block will contain only one component 86 (e.g., an integrated circuit). In other situations, a shielded circuit block will contain multiple components (e.g., one, two, or more than two integrated circuits and one, two, or more associated discrete components). Individual components 86 are shown in the circuit blocks of the cross-sectional views of FIGS. 7, 8, 9, and 10 to avoid over-complicating the drawings.

Printed circuit board 56 may be a rigid printed circuit board (e.g., a fiberglass-filled epoxy board such as an FR4 board), a rigid flex board that has flex circuit tails (e.g., tails formed from polyimide sheets or other flexible polymer sheets), or other suitable substrate material. Components 86 may be mounted to board 56 using solder, conductive adhesive, connectors, or other attachment mechanisms (illustrated schematically as solder balls 62 in FIG. 7). Components 86 may have input-output pads (contacts). Printed circuit board 56 may have mating contacts. When soldered (or otherwise connected) to board 56, the input-output pads of components 86 are electrically connected to the mating contacts of printed circuit board 56.

Board 56 may contain one or more layers of printed circuit board material and one or more corresponding layers of traces such as illustrative trace 64 of FIG. 7. The traces may be formed from copper, other metals, or other conductive materials. Vias (vertical conductive segments) may be used to interconnect traces on respective layers of board 56. Some of the traces on board 56 may be used in routing signals between components 86. For example, the output of one integrated circuits on board 56 may be routed to the input of another integrated circuit on board 56 using a bus formed from multiple parallel traces 64. The traces of board 56 may also be used in forming planar sections that serve as ground planes. One or more of these planar regions of conductor in printed circuit board 56 may form a lower portion of a radio-frequency shield for components 86.

During fabrication of board 56, patterned surface traces such traces 66 may be formed on the exposed upper surface of board 56. Traces 66 may be formed from copper or other metals (as an example). Traces 66 may be interconnected with other traces on board 56 (i.e., traces 64) using vias and other conductive structures). Traces 66 may be formed in the shape of rectangular rings or other shapes that surround circuit blocks 54 of FIG. 6. If, for example, an integrated circuit and several discrete components are to be shielded, a rectangular ring-shaped trace (one of traces 66 of FIG. 7) may surround the integrated circuit and the discrete components.

Figure 8:
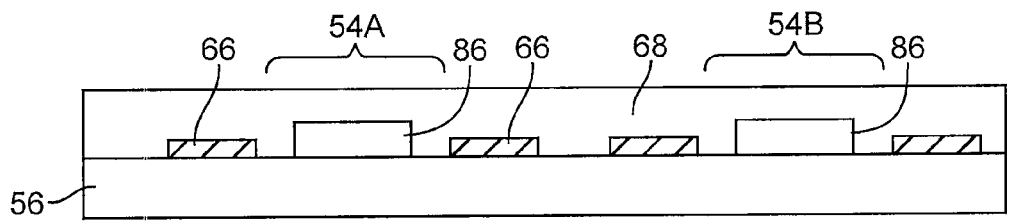
FIG. 8 is a cross-sectional side view of the printed circuit board of FIG. 7 following encapsulation of blocks of circuitry within a dielectric encapsulant layer in accordance with an embodiment of the present invention.

Following patterning of traces 66 and 64, formation of board 56, and mounting of components 86 to board 56 using mounting tool 58, the surface of board 56 may be covered with a layer of dielectric such as layer 68 of FIG. 8. Dielectric layer 68 may be formed from a resin such as epoxy or other suitable encapsulant (sometimes referred to as potting material). Layer 68 may help form an environmental seal that protects components 86 from exposure to dust and moisture.

Layer 68 may also form a substrate for subsequent deposition of one or more layers of conductive coating materials to form radio-frequency shields for the blocks of circuits 54 on board 56. In the example of FIG. 8, there are two blocks of circuitry 54 (block 54A and block 54B). As described in connection with FIG. 6, printed circuit board 56 may have additional blocks of circuitry 54 (e.g., three or more blocks 54, four or more blocks 54, five or more blocks 54, etc.).

Layer 68 may be based on a material that is initially in a liquid state and may be formed by spin coating, by spraying, by screen printing, by dipping, by ink-jet printing, by pad printing, by dripping, or using other coating techniques. One or more sub-layers may be applied to printed circuit board 56 to form layer 68. To harden layer 68, layer 68 may be dried (cured). Examples of treatments that may be used to solidify layer 68 include application of ultraviolet (UV) light (e.g., to UV-cure a UV epoxy), application of heat (e.g., to cure a thermally cured epoxy), and room temperature exposure (e.g., to allow a chemically cured dielectric material to harden and form dielectric layer 68).

Figure 9:
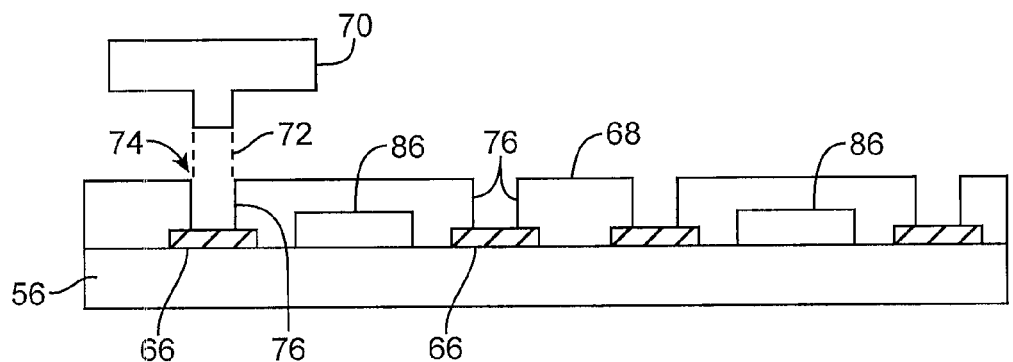
FIG. 9 is a cross-sectional side view of the substrate of FIG. 8 following removal of portions of the encapsulant with a dielectric removal tool to form channels in accordance with an embodiment of the present invention.

After layer 68 has solidified, tools 70 may be used to form channels 74, as shown in FIG. 9. Channels 74 may be formed in ring shapes that surround each separate block 54 of components 86 (see, e.g., the illustrative blocks of components in FIG. 6). Channels 74 may, for example, be formed in rectangular ring shapes surrounding respective rectangular areas on board 56 (as an example).

Tools 70 may include a laser that produces light (illustrated by dashed lines 72) or may include a saw or other mechanical removal tool. Channels 74 may also be formed using masks and etching or other fabrication techniques. When a laser is used, the wavelength of light that is produced by the laser may be selected so that the laser light removes material 68 from channel 74 without removing a significant amount of underlying material in trace 66. An advantage of using a laser rather than a mechanical removal tool such as a saw is that trace 66 may serve as a stop layer that helps restrict the depth of channel 74 and prevents channel 74 from extending excessively (e.g., to a depth that might damage the pattern of interconnect traces 64 within the layers of board 56). Laser removal tools may also be able to form narrower channels (e.g., channels with lateral dimensions of 50-500 microns or less) than saws (which may typically produce cuts of about 600 microns in width). If desired, tools 70 may include dry etching equipment (e.g., a plasma etch tool) to help remove residual particles from the surface of trace 66 following coarse material removal operations with a laser or saw.

Channels 74 are preferably formed in alignment with traces 66, so that channel sidewalls 76 are formed above and overlapping respective portions of traces 66.

Figure 10:
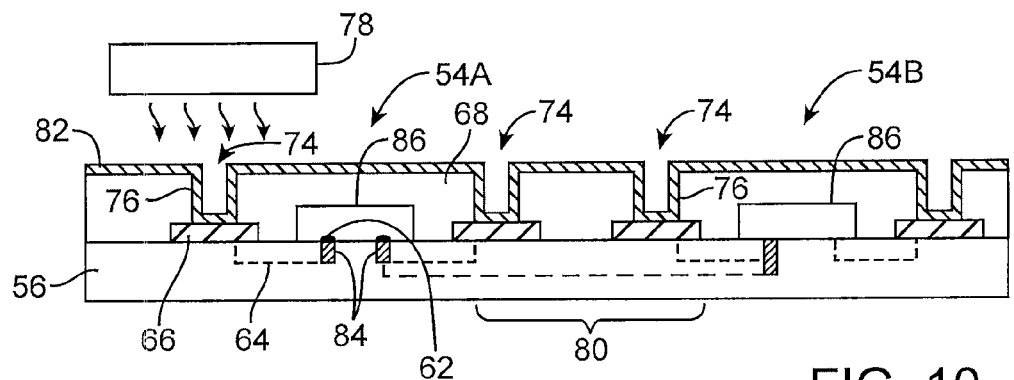
FIG. 10 is a cross-sectional side view of the substrate of FIG. 9 following deposition of a coating layer to cover the channel sidewalls and exposed planar surfaces of the encapsulant regions in accordance with an embodiment of the present invention.

After channels 74 have been formed, tools 78 may be used to deposit one or more layers of conductive coating 82 on the exposed surface of dielectric layer 68, as shown in FIG. 10. Coating 82 may be formed from a conductive material such as silver paint or other suitable conductive material. Coating 82 may be deposited by screen printing, pad printing, dripping, spraying, dipping, ink-jet printing, evaporation, sputtering, other deposition techniques, and combinations of these techniques. Coating 82 may, if desired, be deposited using a conformal deposition process that allows coating 82 to coat sidewalls 76 of channels (grooves) 74.

As shown in FIG. 10, printed circuit board 56 may include conductive traces 64. Traces 64 may be formed from copper, other metals, or other conductive materials and may mate with traces 66 on the surface of board 56. Traces 66, which may be formed from copper, other metals, or other conductive materials, may be electrically connected to traces 64. Traces 64 may, for example, include substantially uninterrupted planar regions (e.g., ground planes) and may serve as the lower portion of radio-frequency shielding structures for board 56.

As shown in FIG. 10, some of traces 64 may be formed between traces 66 and adjacent components 86 and some of traces 64 may run under traces 66 and may be used in interconnecting components 86 in different (and separately shielded) blocks of circuitry. For example, some of traces 66 (e.g., the traces in region 80) may run under channels 74 and may be used in connecting components 86 in circuit block 54A with corresponding components 86 in circuit block 54B. Traces 64 may be formed in one or more layers of printed circuit board 56. Board 56 may have any suitable number of layers (e.g., 1-10 layers or more). Conductive structures such as vias 84 (which may be considered to form part of interconnect traces 64) may be used to interconnect input-output pads on components 86 and solder balls 62 to traces 64.

With the configuration shown in FIG. 10, printed circuit board 56 contains multiple blocks 54 of circuitry each of which contains one or more components 86 and each of which has a respective radio-frequency shielding structure. The radio-frequency shielding structures are made up of the ground plane structures in board 56 (shown as traces 64) that lie under each block 54, the traces 66 that surround each block 54 on board 56, the sidewall portions of conductive layer 82 that coat sidewalls 76 of channels 74, and the planar portion of coating 82 that covers each block 54. In the portion of board 56 that is shown in FIG. 10, there are two complete shielding structures (the left-hand structure that is shielding block 54A and the right-hand structure that is shielding block 54B). If desired, board 56 may have additional shielding structures (e.g., three or more, four or more, five or more, etc.). FIG. 6 shows an illustrative layout in which each of five different blocks of components 54 has a respective shielding structure.

Figure 11:
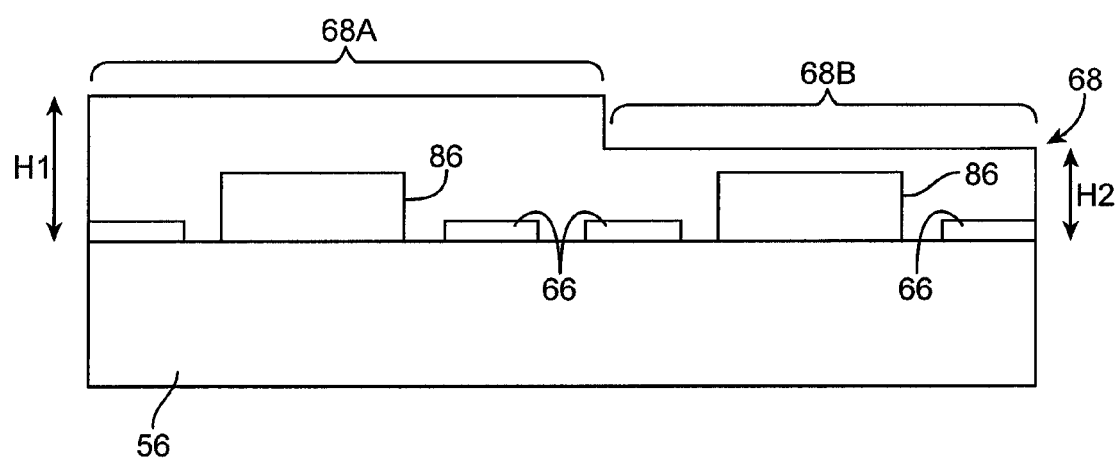
FIG. 11 is a cross-sectional side view of a printed circuit board having encapsulant that has been formed with two different thicknesses on the printed circuit board in accordance with an embodiment of the present invention.

As shown in FIG. 11, dielectric layer 68 may have portions with different heights. For example, dielectric layer portion 68A may have a height (thickness) H1 that is greater than the height (thickness) H2 of dielectric layer portion 68B. The lower height H2 of region 68B may help make it possible to install board 56 in a compact housing. Portion 68B may be formed by removing some of the upper portion of a layer that was deposited at the same time as portion 68A or layer 68A may be built up with respect to portion 68B (e.g., by adding an additional coating or using a mold with different heights).

Figure 12:
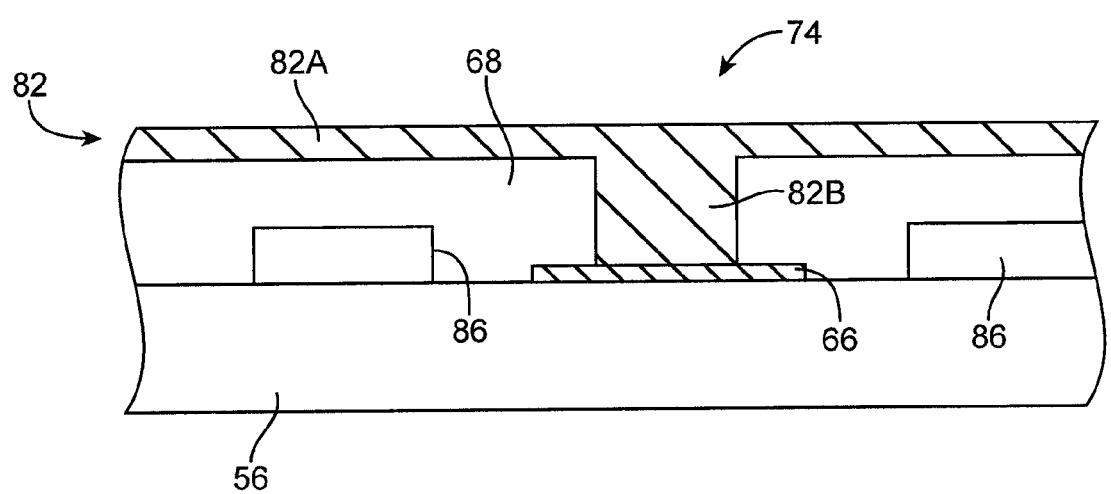
FIG. 12 is a cross-sectional side view of an illustrative printed circuit board showing how a layer of conductive coating material may fill substantially all of a channel in an encapsulant layer in accordance with an embodiment of the present invention.

FIG. 12 shows how channel 74 may be completely filled with portion 82B of coating 82. Portion 82A of coating 82 may cover the planar upper surface of encapsulant 68. Portions 82A and 82B may be formed during a single application of coating 82 (e.g., a single screen printing operation) or may be formed using a sequence of multiple separate coating operations each of which deposits a respective portion of coating 82.

Figure 13:
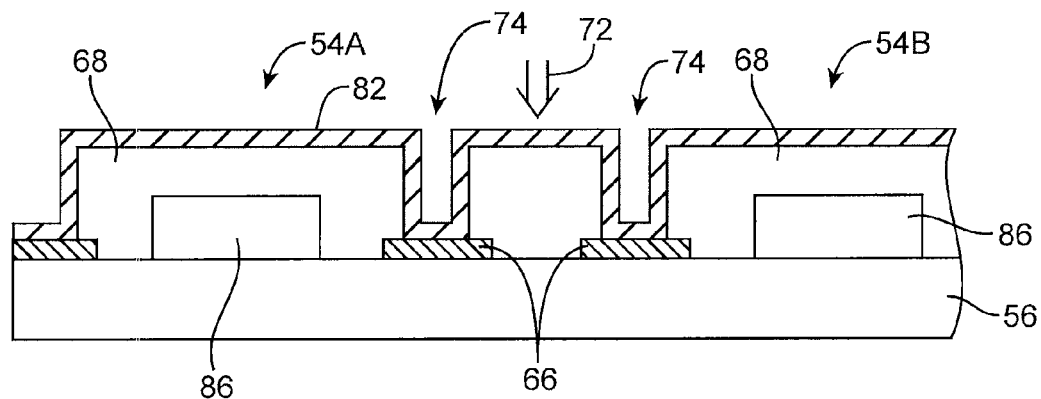
FIG. 13 is a cross-sectional side view of an illustrative printed circuit board showing how conductive coating material may conformally coat the sidewall surfaces of channels in an encapsulant layer to form radio-frequency shielding structure sidewalls in accordance with an embodiment of the present invention.
Figure 14:
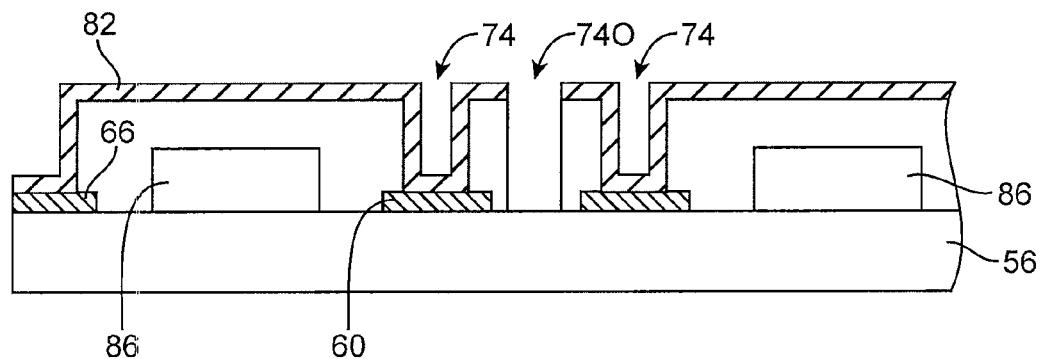
FIG. 14 is a cross-sectional side view of the illustrative printed circuit board of FIG. 13 after removing a portion of the conductive material to separate the radio-frequency shielding structures for two adjacent blocks of circuitry in accordance with an embodiment of the present invention.

The radio-frequency shielding structures that are associated with each circuit block 54 may be electrically connected (grounded) to each other or may be electrically isolated from one another. FIGS. 13 and 14 illustrate how an opening may be formed between adjacent radio-frequency shielding structures in a scenario in which it is desired to isolate the radio-frequency isolation structures from each other. Initially, a radio-frequency shielding configuration of the type shown in FIG. 10 may be formed. Channels 74 may have coated sidewalls as shown in FIG. 13 or may be completely filled with conductive material 82 as illustrated in FIG. 12. After forming the electrically connected shielding structures of FIG. 13, laser light 72 may be applied to form channel 740 of FIG. 14 or other cutting mechanisms such as a saw may be used to form channel 740. Channel 740 may run around the periphery of one or both of blocks 54A and 54B to form a continuous opening in shielding layer 82 that electrically separates the radio-frequency shielding structures of block 54A from the radio-frequency shielding structures of block 54B.

Figure 15:
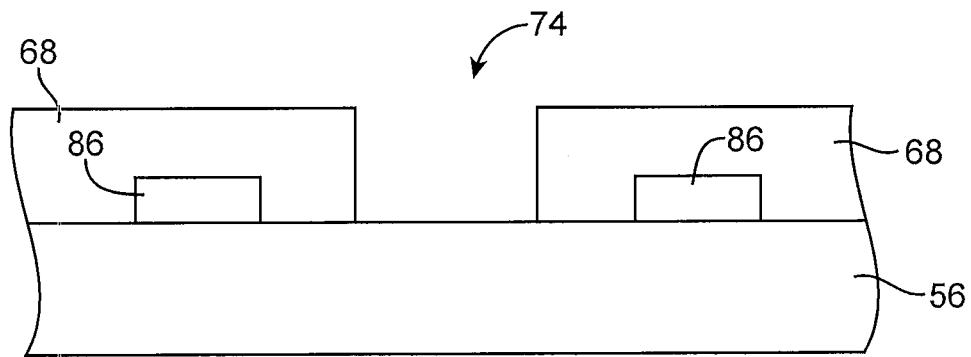
FIG. 15 is a cross-sectional side view of a printed circuit board following attachment of components, encapsulation of the components with a layer of encapsulant, and formation of a channel between blocks of circuitry each of which is formed from one or more of the components in accordance with an embodiment of the present invention.
Figure 16:
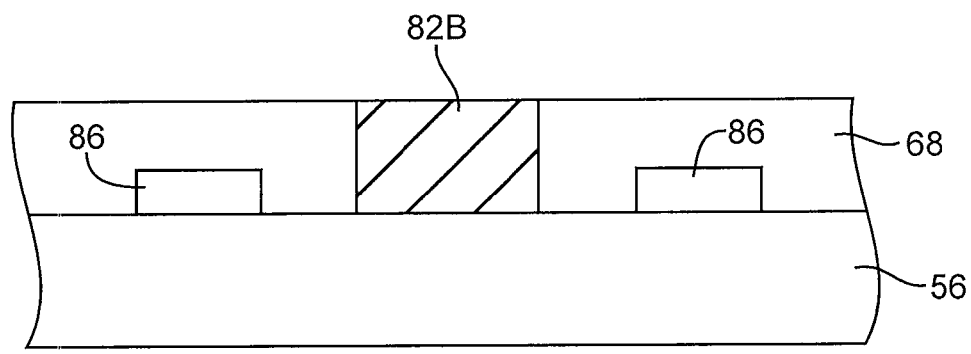
FIG. 16 is a cross-sectional side view of the printed circuit board of FIG. 15 following deposition of a layer of conductive material to fill the channel between the components in accordance with an embodiment of the present invention.
Figure 17:
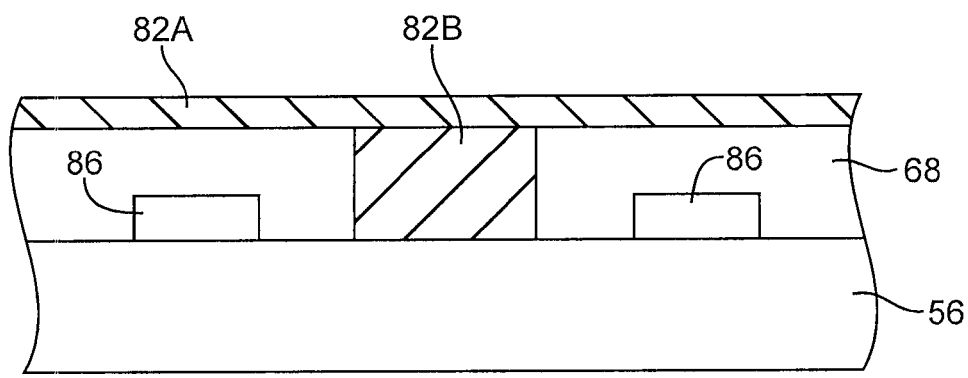
FIG. 17 is a cross-sectional side view of the printed circuit board of FIG. 17 following application of an additional layer of conductive material to the exposed planar upper surfaces of the encapsulated components on the printed circuit board in accordance with an embodiment of the present invention.

FIGS. 15, 16, and 17 are cross-sectional side views of printed circuit board 56 showing how channels 74 may be filled using multiple layers of coating material 82. Initially, channel 74 may be formed in dielectric layer 68, as shown in FIG. 15. In a first deposition step (e.g., using screen printing or other suitable techniques), conductive material 82B (e.g., silver paint or other metallic paint or conductive liquid coating material) may be deposited within channel 74, as shown in FIG. 16. A low-viscosity material may be used to fill channel 74 (e.g., using a wicking action produced by the relatively narrow width of channel 74). Due to the viscosity of material 82B (e.g., its potentially low viscosity), it may not be possible to uniformly coat the exposed surface of dielectric layer 68 during the first deposition step. In a second deposition step (e.g., using screen printing or other suitable technique with a potentially more viscous coating material), conductive material 82A with a higher viscosity may therefore be deposited over the exposed surface of dielectric layer 68, as shown in FIG. 17.

Figure 18:
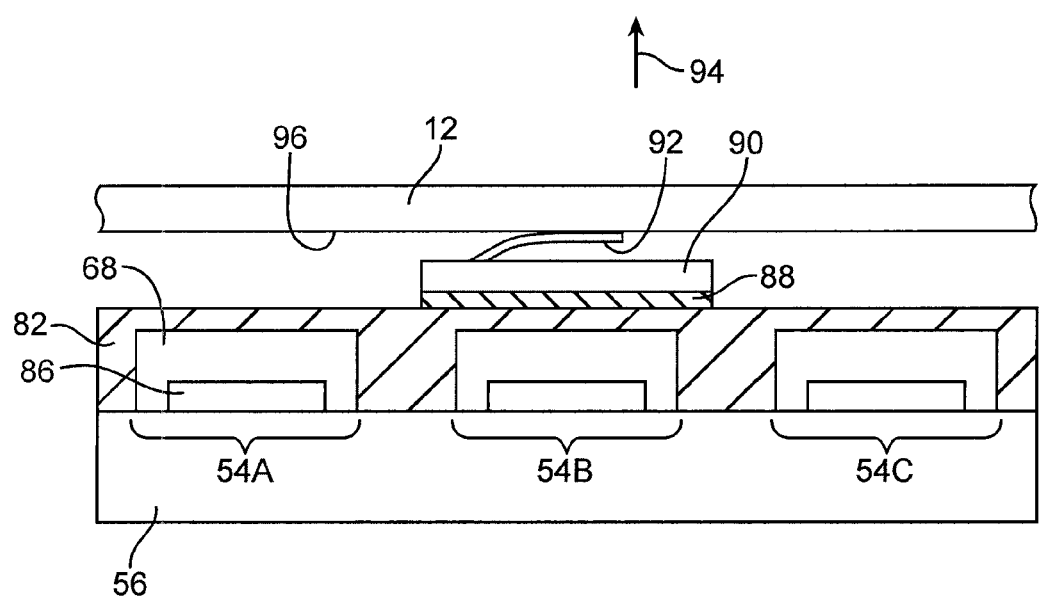
FIG. 18 is a cross-sectional side view of a printed circuit board with integral radio-frequency shielding structures and a conductive spring structure that facilitates the formation of an electrical connection between the shielding structures and a conductive housing wall in accordance with an embodiment of the present invention.

It may be desirable to form grounding contacts or other electrical connections between a radio-frequency shielding structure formed from conductive layer 82 and a conductive housing wall or other conductive structure in device 10. This may be accomplished using a spring or other flexible conductive component that is mounted to coating 82, as shown in FIG. 18. In the FIG. 18 example, coating layer 82 is being used to form respective radio-frequency shielding structures for three blocks of circuitry (block 54A, block 54B, and block 54C). Conductive structure 90 may have a flexible portion 92 that is biased upwards in direction 94. Conductive structure 90 may be, for example, a sheet of metal and portion 92 may be a tab that extends upwards from the sheet of metal. Because portion 92 is biased upwards, the upper surface of portion 92 presses against interior (lower) surface 96 of metal housing wall 12 and forms an electrical contact. This type of arrangement may be used when it is desired to electrically connect the radio-frequency shielding structures formed from conductive coating 82 to conductive device structures such as conductive housing structure 12. Structure 12 may be, for example, a planar wall that forms the rear of device 10 (when viewed in the orientation of FIG. 1). Structure 90 may be connected to layer 82 by placing structure 90 on layer 82 when layer 82 is wet, using conductive adhesive 88, or using other suitable attachment mechanisms.

Figure 19:
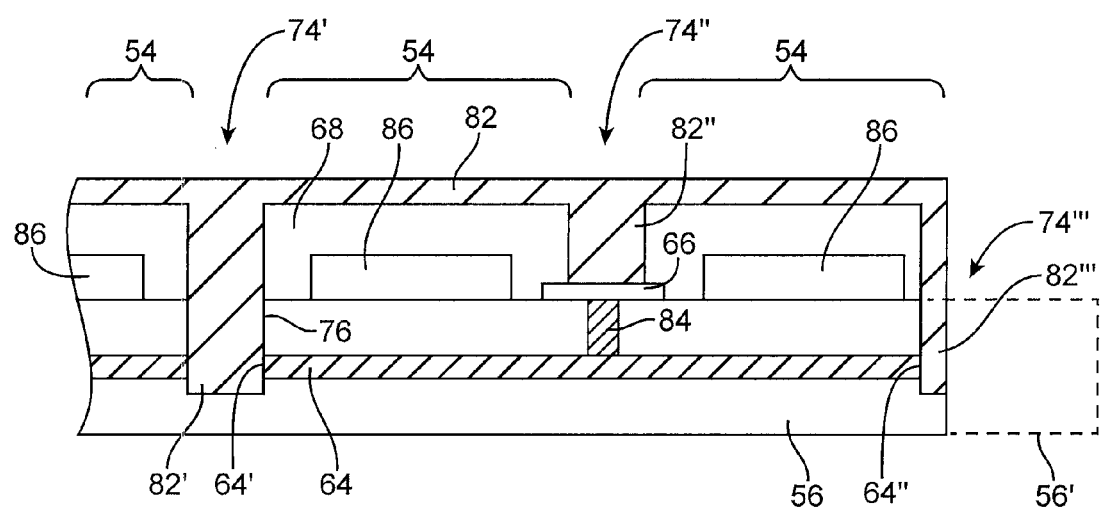
FIG. 19 is a cross-sectional side view of an illustrative printed circuit board having integral radio-frequency shielding structures with filled channels and coated end regions in accordance with an embodiment of the present invention.

Channels 74 may extend only to the surface of printed circuit board 56 or may extend partly into board 56. The cross-sectional side view of printed circuit board 56 of FIG. 19 shows how channels 74 may have different shapes in different regions of the same printed circuit board (as an example). In the FIG. 19 example, channel 74' has been formed through encapsulant layer 68 and partly into the interior of board 56. Channel 74' extends sufficiently into board 56 that the sidewalls of channel 74' extend past edges 64' of conductive trace layer 64 (e.g., one or more ground plane layers in board 56). This allows the conductive material that fills channel 74' to form an electrical connection with layer 64. Channel 74" extends through layer 68, but terminates at the surface of board 56 on trace 66. Electrical connection between material 82" in channel 74" and layer 64 may be made by conductive structures such as via 84. Structure 74''' may be formed along the edge of board 56 (e.g., using a sawing technique of the type described in connection with FIG. 5). This removes board portion 56' from board 56 and leaves coating material 82''' along the exposed edge of board 56. Coating material 82''' may form an electrical contact with edge 64" of one or more ground plane layers 64 in board 56.

Figure 20:
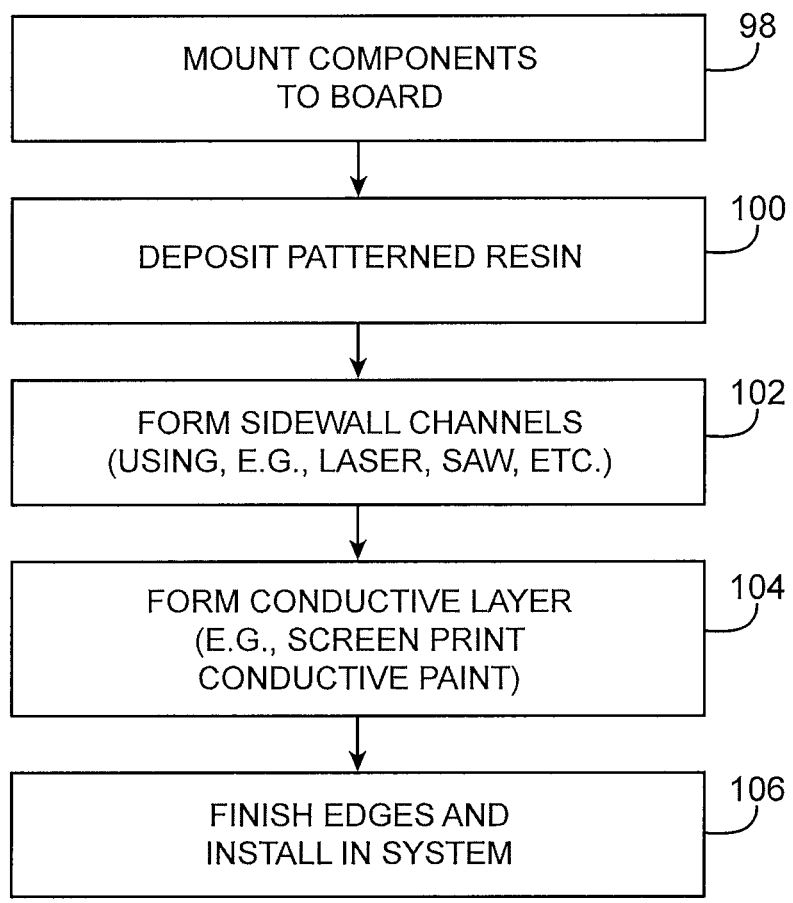
FIG. 20 is a flow chart of illustrative steps involved in forming printed circuit boards with integral radio-frequency shielding structures in accordance with an embodiment of the present invention.

FIG. 20 is a flow chart of illustrative steps involved in forming printed circuit boards with multiple integral radio-frequency shields each of which shields a respective block of circuit components such as blocks 54 of FIG. 6.

At step 98, components 86 may be mounted on board 56. Components 86 may be arranged using a layout of the type shown in FIG. 6 in which functionally related circuit components are grouped together. For example, one block 54 of components 86 may form radio-frequency transceiver circuitry and another block 54 of components 86 may form processing circuitry. Components may be soldered to printed circuit board 56 (e.g., using an automated soldering tool and/or manual soldering techniques), may be mounted on board 56 using conductive adhesive, or may be otherwise attached to the surface of board 56.

During the operations of step 100, components 86 may be encapsulated in resin. For example, one or more coatings of epoxy or other dielectric material 68 may be deposited on components 86.

At step 102, a laser or other cutting tool may be used to form channels 74. A laser may advantageously be used to remove portions of dielectric material 68 above traces 66 without removing traces 66 (e.g., due to the reflectively of traces 66). The laser that is used to remove material 68 may be an infrared laser, a ultraviolet laser, a visible laser, a pulsed laser, a continuous wave laser, etc. Reactive ion etching, plasma etching, or other operations for cleaning and removing excess material may be used in combination with laser patterning of layer 68 if desired. The pattern of channels 74 that is formed in layer 68 may surround each respective block 54 of components without separating printed circuit 56 into individual pieces and without damaging any of the traces 64 in board 56 that are used to interconnect the circuitry of respective blocks 54.

At step 104, conductive material 82 (e.g., silver paint or other metallic material) may be deposited in channels 74.

Screen printing or other deposition techniques may be used in filling channels 74. One or more coating layers may be used in filling channels 74. Channels 74 may be completely filled or may be partially filled (e.g., so that only the sidewalls of channels 74 are coated).

Following formation of the conductive material 82 in channels 74, edge portions of board 56 may be sawed off (e.g., to remove board portion 56' of FIG. 19 while leaving portion 56 and edge portion 82''' of coating layer 82 in place). In configurations in which it is desired to separate individual radio-frequency shields from each other, a laser or other cutting tool may be used to form openings in layer 82 such as opening 740 in FIG. 14. If desired, one or more spring structures such as structure 90 of FIG. 18 may be attached to layer 82. Board 56 may then be mounted in device 10 (e.g., so that structure 90 shorts the radio-frequency shielding structures to a metal housing wall or other conductive device structure).

The foregoing is merely illustrative of the principles of this invention and various modifications can be made by those skilled in the art without departing from the scope and spirit of the invention.

What is claimed is:

1. Apparatus, comprising:
   a printed circuit board substrate having a plurality of integrated circuits;
   a dielectric encapsulant that encapsulates the integrated circuits;
   at least one channel in the dielectric encapsulant between adjacent integrated circuits;
   a conductive material that at least partly fills the channel and that coats the dielectric encapsulant to form radio-frequency shields for each of the integrated circuits; and
   at least one isolating channel that substantially surrounds at least a given one of the radio-frequency shields and that electrically separates the at least given one of the radio-frequency shields from at least another one of the radio-frequency shields, wherein the at least one isolating channel comprises an opening that extends through the layer of conductive material and the dielectric encapsulant.

2. The apparatus defined in claim 1 wherein the printed circuit board comprises traces that interconnect the integrated circuits and wherein at least some of the traces comprise substantially planar regions that extend lower portions of at least one of the radio-frequency shields at least partly underneath at least one of the integrated circuits.

3. The apparatus defined in claim 1 wherein the integrated circuits include a first integrated circuit and a second integrated circuit, wherein the channel is interposed between the first and second integrated circuits, and wherein the printed circuit board includes interconnect traces that interconnect the first and second integrated circuit and that pass under the channel.

4. The apparatus defined in claim 3 wherein the printed circuit board has a surface on which the first and second integrated circuits are mounted and at least one trace on the surface that lies under the channel.

5. The apparatus defined in claim 4 wherein the conductive material in the channel contacts the trace on the surface of the printed circuit board.

6. The apparatus defined in claim 5 wherein the conductive material comprises silver paint.

7. The apparatus defined in claim 6 wherein the printed circuit board comprises a sawed edge that is at least partly covered by some of the conductive material.

8. The apparatus defined in claim 1 wherein the channel comprises a laser-cut channel that surrounds at least one of the integrated circuits.

9. The apparatus defined in claim 1 wherein the at least one channel comprises at least first and second channels at least partly filled by the conductive material, wherein the printed circuit board substrate lies in a plane, wherein the first and second channels each have a height dimension that is perpendicular to the plane, and wherein the height of the first channel is less than the height of the second channel.

10. The apparatus defined in claim 1 wherein the at least one channel comprises at least first and second channels at least partly filled by the conductive material, wherein the printed circuit board has a surface on which the integrated circuits are mounted, wherein the first channel extends from above the surface of the printed circuit board to below the surface of the printed circuit board, and wherein the second channel does not extend below the surface of the printed circuit board.

* * * * *